United States Patent [19]
Daoud

[11] Patent Number: 6,083,032
[45] Date of Patent: Jul. 4, 2000

[54] PIN ADJUSTMENT FIXTURE FOR PRINTED WIRING BOARD (PWB) MOUNTING

[75] Inventor: Bassel Hage Daoud, Parsippany, N.J.

[73] Assignee: Lucent Technologies Inc., Murray Hill, N.J.

[21] Appl. No.: 09/045,550

[22] Filed: Mar. 20, 1998

[51] Int. Cl.[7] .................................................. H01R 13/64
[52] U.S. Cl. ........................ 439/374; 439/603; 439/589
[58] Field of Search .................................. 439/374, 375, 439/376, 377, 378, 379, 380, 381, 586, 589, 594, 590, 591, 592–5, 596–7, 598–600, 603, 76.1, 737, 946, 816–7, 736, 733; 174/261, 117 F, 117 FF; 361/752, 758, 759

[56] References Cited

U.S. PATENT DOCUMENTS

| | | | |
|---|---|---|---|
| 4,434,321 | 2/1984 | Betts | 174/68.5 |
| 4,654,967 | 4/1987 | Thenner | 29/860 |
| 5,057,023 | 10/1991 | Kabadi et al. | 439/67 |
| 5,827,093 | 10/1988 | Okabe | 439/572 |

*Primary Examiner*—Lincoln Donovan

[57] ABSTRACT

An adjustment fixture for aligning pins on a protector panel to facilitate insertion of a printed wiring board thereon. The adjustment fixture includes an alignment comb having a plurality of substantially parallel beams, each having a thickness. The comb is placed between rows or columns of pins on the protector panel to straighten and impede unintended displacement or movement of the pins. A beam receptacle brace is provided for attachment to an end of the beams so as to maintain the beams in an appropriate fixed spacing so that the printed wiring board can be mounted to the pins.

10 Claims, 4 Drawing Sheets

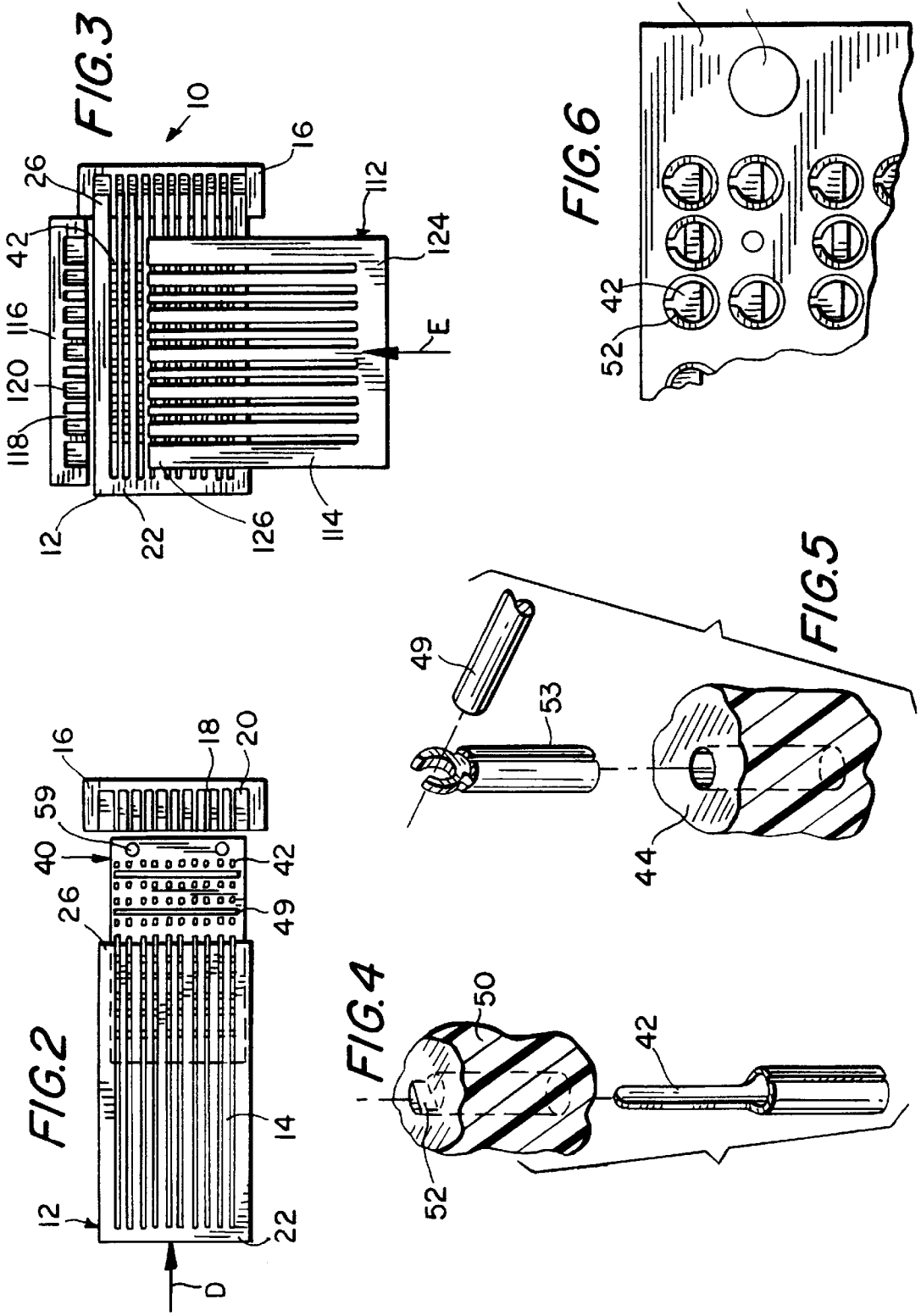

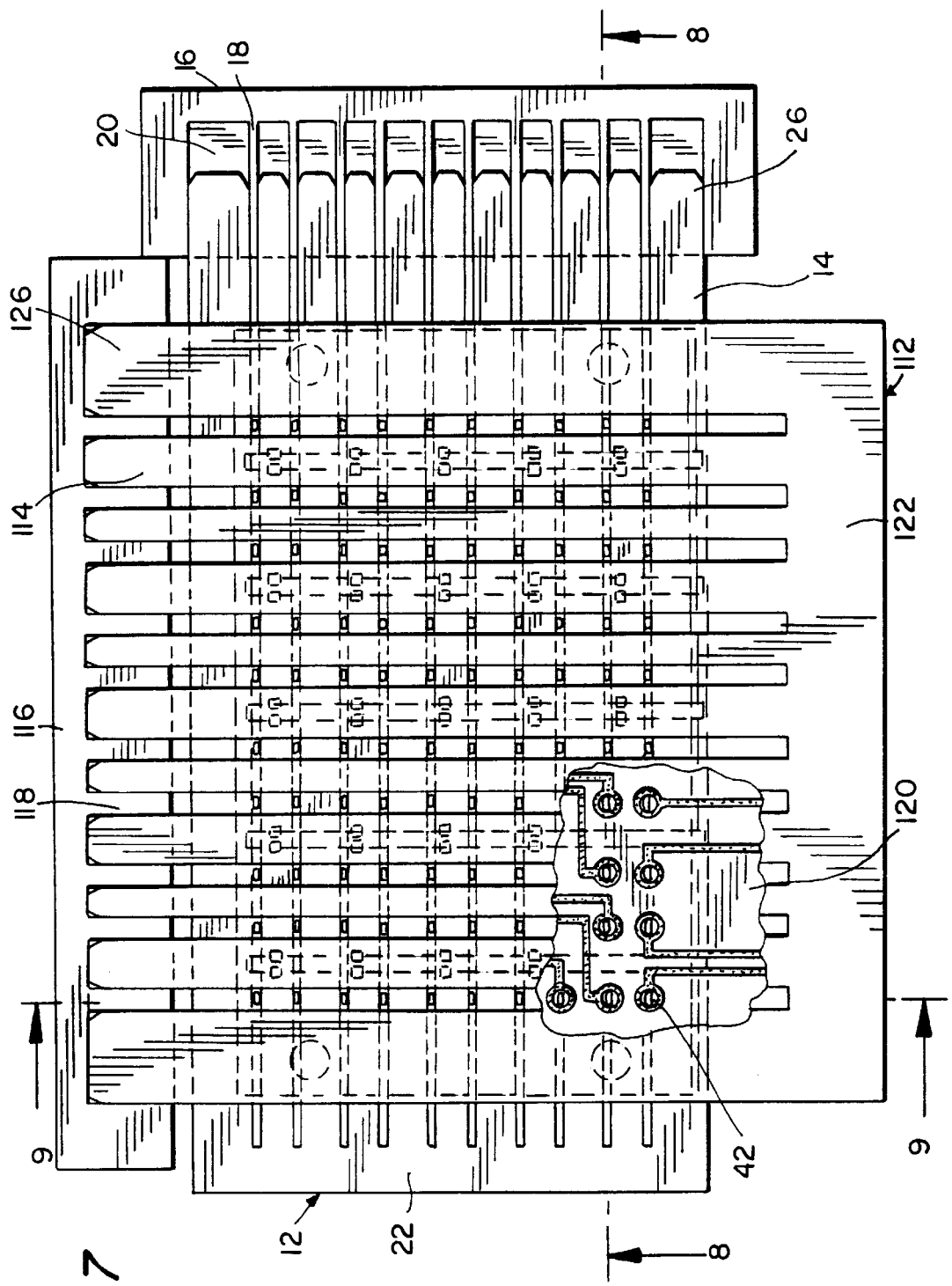

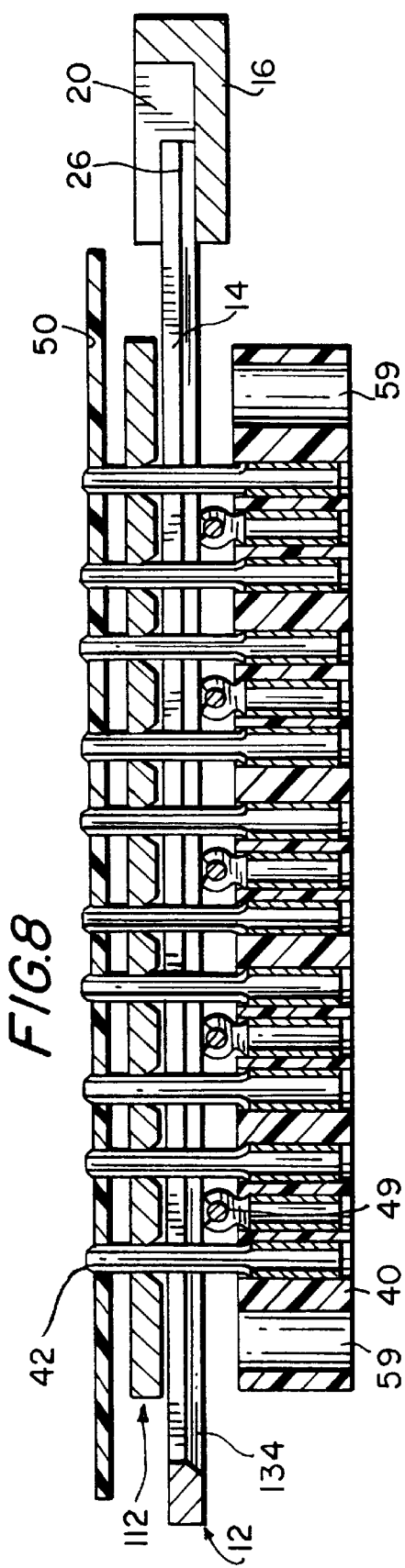
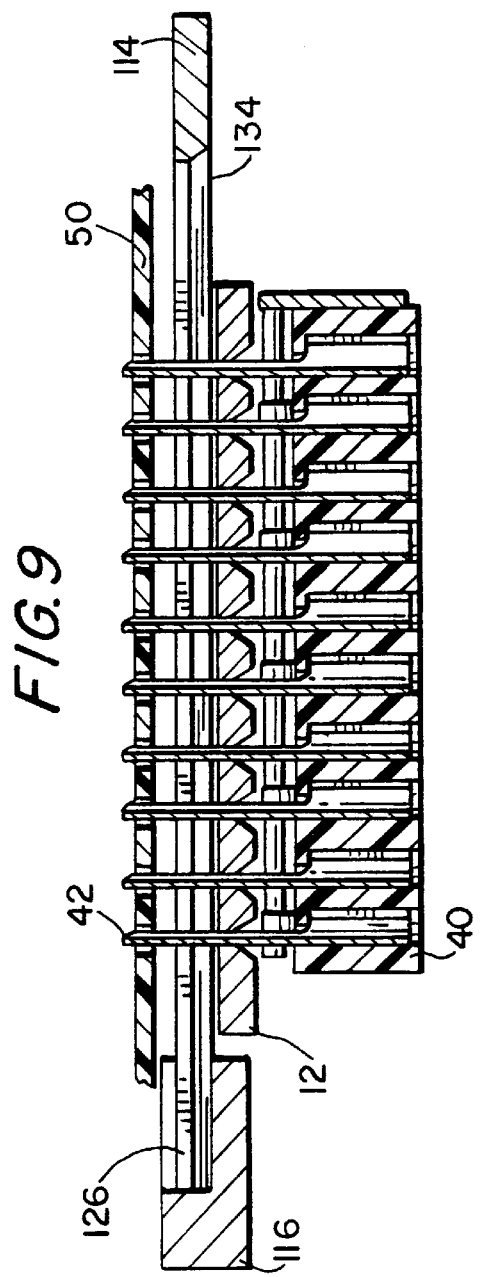

PIN ADJUSTMENT FIXTURE FOR PRINTED WIRING BOARD (PWB) MOUNTING

BACKGROUND OF THE INVENTION

I. Field of the Invention

The present invention relates to hardware components for telecommunication systems. More particularly, the invention is directed to a device for assisting in the installation of printed wiring boards onto protector panels of a building entrance protector (BEP) unit.

II. Description of the Related Art

Building entrance protectors are commonly used as an interface between communication lines from a central office and communication lines in an indoor environment, as for example in office buildings, apartment buildings, etc. The communication lines from a central office and from an indoor environment are connected to a protector panel contained in the BEP which has a plurality of flexible conductive pins arranged in rows and columns. In the past, communication lines have typically been attached to the pins by wire wrapping to provide the electrical connection between the pins and the communication lines. The process of wire wrapping is, however, time consuming and costly, thereby resulting in increased cost for equipment installation and requiring longer installation time.

As an alternative to wire wrapping, a printed wiring board (PWB) can be used to facilitate connection of terminal device equipment to protector panels. PWBs contain conductive leads or paths to direct electric signals to and from the protector panel. The leads terminate at holes or cavities which are arranged in a particular pattern to mask the configuration of the pins on the protector panel. The cavities are dimensioned to accommodate insertion of the pins therein to provide for electrical connection between the pins and the PWB. Once the pins are in place in the PWB cavities, solder can be applied to secure the pins in place and improve conductivity between the protector panel and the communication lines. A problem arises, however, in that normal handling of the protector panel causes the flexible pins to become bent or otherwise out-of-alignment with the rigid and fixed cavity locations on the PWBs. Thus, placement of the PWBs over the pins becomes a difficult, tedious and time consuming task.

SUMMARY OF THE INVENTION

The present invention provides a pin adjustment fixture for facilitating installation and connection of a PWB to a pin array of a protector panel. The adjustment fixture includes an alignment comb having a plurality of substantially parallel beams or teeth. Each beam has a first end connected to a support, a second end and a bottom edge, with either or both of the second end and bottom edge being tapered to facilitate placement between rows and columns of pins on the protector panel. When so positioned, a beam receptacle is placed over the second ends of the beams to fixedly maintain the spacings between adjacent beams so that partial alignment of the pin array with holes contained in the PWB is effectuated. The resulting alignment of the pin array advantageously facilitates mounting of the PWB thereon.

In a preferred embodiment, a second alignment comb with a second beam receptacle is used to fully secure and maintain the pins in a proper fixed location to better facilitate mounting of a PWB thereon. Thus, for example, when both alignment combs are used, the first comb will impede movement of the pins in an "x" direction, and the second alignment comb will prevent or impede movement of the pins in a "y" direction. Once restrained in such a manner, the pins are aligned with the holes in a PWB so as to allow easy mounting of the PWB thereon.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views:

FIG. 2 is a top plan view of a first alignment comb and first beam receptacle shown being moved into position over a protector panel;

FIG. 3 is a top plan view of a second alignment comb and second beam receptacle shown being moved into position over a protector panel;

FIG. 4 is a partial perspective view of an interface between a connector pin and a printed wiring board;

FIG. 5 depicts a partial perspective view of cross connections of a PWB;

FIG. 6 is a top plan view of a PWB positioned over pins of a protector panel;

FIG. 7 is a top plan view of the pin adjustment fixture of the present invention with a break-away view of a PWB;

FIG. 8 is a cross-sectional view of the adjustment fixture of FIG. 7 taken along the line 8—8; and FIG. 9 is a cross-sectional view of the device of FIG. 7 taken along the line 9—9.

DETAILED DESCRIPTION OF THE PRESENTLY PREFERRED EMBODIMENTS

Figure 1:
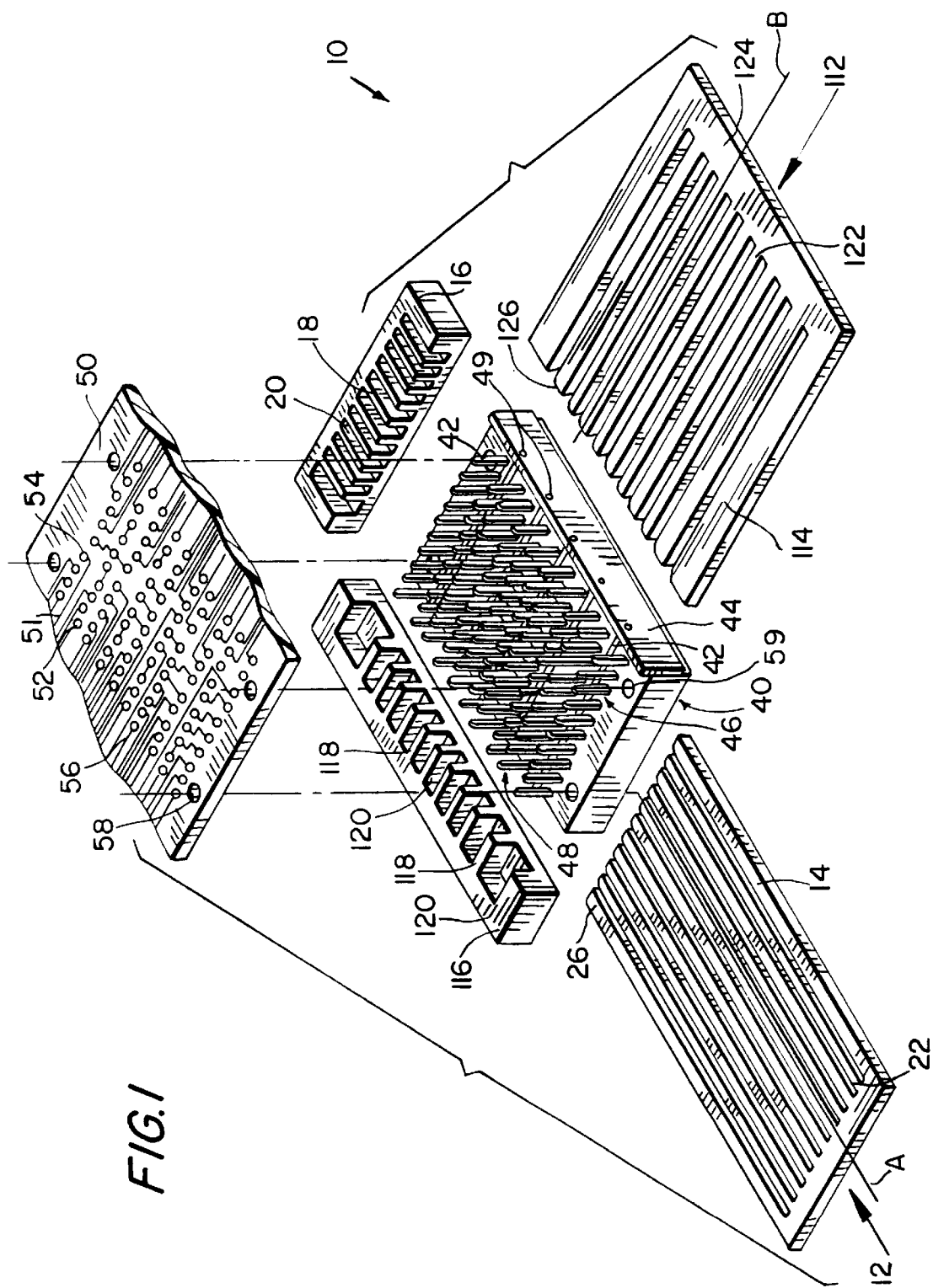
FIG. 1 is an exploded perspective view of a pin adjustment fixture in accordance with the present invention.

A pin adjustment fixture 10 constructed in accordance with a preferred embodiment of the present invention is depicted in FIG. 1. As shown, fixture 10 is intended for use with a protector panel 40 of the type incorporated in building entrance protector units employed in telecommunications systems. Protector panel 40 includes a securing plate 44 constructed of an insulating material, e.g. plastic, to which a plurality of flexible conducting pins 42 are mounted. The pins 42 are typically constructed of copper and arranged in rows 46 and columns 48 and are flexible to facilitate connection to communication lines (not shown) via wire wrapping. The pins 42 are of a particular thickness and are grouped together, as is known in the art, as for example into 5-pin groupings for a 5 pin type protector, by cross-connector rails 49 connected to fasteners 53 which, in turn, are secured to securing plate 44 (as shown in FIG. 5).

As a preferred substitute for wire wrapping connection lines to individual pins 42 and in accordance with the present invention, a printed wiring board (PWB) 50 may be employed. PWB 50 has a plurality of leads 51 or connectors which, when brought in contact with pins 42, form an electrical connection therebetween. Each lead 51 terminates at a cavity or hole 52 which is coated with conducting material to form a connection with a pin 42 when inserted therein, as more fully discussed below. Like pins 42, holes 52 are arranged in columns and rows. PWB 50 also includes several mounting screw holes 58 which, when PWB 50 is mounted to the protector panel 40 in accordance with the present invention, align with mounting screw holes 59 contained in securing plate 44 so that fasteners or screws can be inserted into mounting screw holes 58, 59 to secure PWB 50 to securing plate 44.

With continued reference to FIG. 1, and with further reference now to FIGS. 2 and 3, the inventive fixture 10 includes a first alignment comb 12 containing a plurality of beams or teeth 14 which are connected at a first end to a comb support 22. Each beam 14 has a longitudinal axis "A" and a second end 26 for engagement with rows 46 of pins 48. Beams 14 are spaced a fixed distance from each other to accommodate insertion of the beams between the respective rows of pins. In particular, the spacing between adjacent beams is substantially equal to the thickness of the pins. The comb support 22 and beams 14 are preferably integrally formed from a durable lightweight material such as aluminum or plastic. In use, alignment comb 12 is slidingly advanced in the direction of arrow D into engagement with the rows of pins 42, as shown in FIG. 2, so that each beam 14 is positioned between two adjacent rows of pins. Such positioning of the comb 12 straightens pins 42 into a substantially vertical orientation with respect to securing plate 44 and prevents pin movement in a direction perpendicular to the longitudinal axes "A" of beams 42. In a preferred embodiment, and to further facilitate insertion of beams 14 between adjacent pin rows 46, the second end of each beam 14 is tapered.

In order to ensure proper alignment and spacing between adjacent pin rows 46, a beam receptacle brace 16 provides equidistant spacing between adjacent beams 14 in alignment comb 12. As shown, brace 16 contains a plurality of dividing walls 18 forming recesses 20. Each recess 20 has an opening substantially equal to the width of each beam 14 and receives a corresponding second end 26 of each beam.

As described above, the use of alignment comb 12 in conjunction with beam receptacle brace 16 will secure pin rows 46 from movement in one direction, i.e. in a direction perpendicular to the longitudinal axes "A" of beams 14. In some situations this may maintain pins 42 in a proper fixed position to facilitate placement of PWB 50 thereon so that pins 42 are received within connection pin holes 52 (as shown in FIGS. 4 and 6); nevertheless, in most situations it will still be difficult to mount PWB 50 in an intended manner due to the ability of pins 42 to move in a transverse or parallel direction relative to the longitudinal axes "A" of beams 14. Accordingly, in a preferred embodiment a second alignment comb 112 is also provided. Second alignment comb 112, like first comb 12 discussed above, has a plurality of beams 114 each having a longitudinal axis "B" and mounted at one end to a comb support 124. Beams 114 are spaced apart from each other to accommodate their insertion between respective columns 148 of pins 42. Comb 112 is also used in conjunction with a second beam receptacle brace 116 having a plurality of dividing walls 118 for forming a plurality of recesses 120 in which second ends 126 of beams 114 are received when the beams 114 are positioned between pin columns 48 by sliding comb 112 in the direction indicated by arrow "E" in FIG. 3. As should be appreciated, the use of first comb 12 and second comb 112 will maintain a precise fixed position for each pin 42 on the protector panel 40. When the pins are thus secured and locationally fixed in accordance with the present invention, PWB 50 and, in particular, the connection pin holes 52 formed therein will align with pins 42 so that they can be easily received within holes 52.

The overlay of first and second alignment combs 12, 112 with PWB 50 is depicted in FIG. 7–9. When pins 42 are fixedly secured and maintained in position in accordance with the present invention, the pins are seated within connection pin holes 52 of PWB 50 as shown in region 120 of FIG. 7. With PWB 50 so-positioned, electrical fastening and connection material, such as solder, can be applied to an upper surface of the PWB to maintain the electrical connection between leads 51 and pins 42, as is known in the art. In addition, PWB 50 can be further secured to protector panel 40 via screws engaging mounting screw holes 58 and 59. Once PWB 50 is thereby secured in position, alignment combs 12 and 112 may be removed by disconnecting their respective beam receptacle braces 16, 116 and sliding the combs outward in the direction opposite that in which they were inserted.

An additional benefit of the present invention is that the alignment combs also function to reduce the height of the pins 42 to an appropriate level so that when PWB 50 is positioned thereon, only the length of pin 42 necessary for effecting the electrical connection will protrude through each connection pin hole 52. In other words, each alignment comb is constructed of a particular thickness which, when overlaid above each other within the array of pins 42 as described above, results in a small amount of clearance remaining for each pin to protrude through the PWB 50. As such, soldering can be applied, as is known in the art, to an appropriate portion of each pin 42, i.e. to the protruding portion.

In a preferred embodiment, and as shown in FIGS. 8 and 9, each beam 14 has a tapered lower wall 134. The tapered lower wall facilitates insertion of beams 14 between columns 48 as the combs slide over the pins 42 from a direction above the pins. Of course, once PWB 50 is secured in place, combs 52 must be removed by sliding as described above.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and method steps which perform substantially the same function in substantially the same way to achieve the same results are within the scope of the invention. It is the intention, therefore, to be limited only as indicated by the scope of the claims appended hereto.

I claim:

1. An adjustment fixture for aligning conducting pins arranged in predeterminantly spaced apart columns and rows on a protector panel so as to facilitate electrical connection of a printed wiring board to the conducting pins, comprising:

an alignment comb having a comb support and a plurality of spaced apart elongated beams, each said beam having a longitudinal axis, a thickness, a first end connected to said comb support, and a second end, said thickness being substantially equal to the predetermined spacing between adjacent ones of the columns and rows of conducting pins; and a beam receptacle having a plurality of recesses for receiving said second ends of said beams so that when said elongated beams of said alignment comb are removably placed in the spacing between adjacent ones of one of the columns and the rows of conducting pins and said beam receptacle is removeably placed on said second ends of said beams, the conducting pins are maintained in a fixed position relative to a direction perpendicular to the longitudinal axes of said elongated beams for facilitating connection of the pins to the printed wiring board.

2. The adjustment fixture of claim 1, wherein said second ends of said beams are tapered to facilitate removable insertion of said beams into the spacing between adjacent ones of the columns and rows of pins.

3. The adjustment fixture of claim 1, wherein each of said beams has an elongated tapered edge for facilitating removable insertion of said beams into the spacing between adjacent ones of the columns and rows of pins.

4. The adjustment fixture of claim 2, wherein each of said beams has an elongated tapered edge for facilitating removable insertion of said beams into the spacing between adjacent ones of the columns and rows of pins.

5. The adjustment fixture of claim 1, wherein said alignment comb is a first alignment comb, said fixture further comprising a second alignment comb having a second comb support and a plurality of spaced apart elongated beams, each said beam of said second alignment comb having a longitudinal axis, a thickness, a first end connected to said second comb support, and a second end, said thickness of said each beam of said second alignment comb being dimensioned for seating within the spacing between the other of adjacent ones of the columns and rows of conducting pins; and a second beam receptacle having a plurality of recesses for receiving said second ends of said second alignment comb beams so that when said second alignment comb beams are removably placed in the spacing between adjacent ones of the other of the columns and the rows of conducting pins and said second beam receptacle is removably placed on said second ends of said second comb beams, the conducting pins are further maintained in a fixed position relative to a direction perpendicular to the longitudinal axes of said second comb elongated beams for facilitating connection of the pins to the printed wiring board.

6. The adjustment fixture of claim 5, wherein said second ends of said first comb beams and said second ends of said second comb beams are tapered to facilitate removable insertion of said beams into the spacing between adjacent ones of columns and rows of pins.

7. The adjustment fixture of claim 5, wherein each of said first comb beams and said second comb beams has an elongated tapered edge for facilitating removable insertion of said beams into the spacing between adjacent ones of the columns and rows of pins.

8. The adjustment fixture of claim 6, wherein each of said first comb beams and said second comb beams has an elongated tapered edge for facilitating insertion of said beams into the spacing between adjacent ones of columns and rows of pins.

9. The adjustment fixture of claim 8, wherein said first comb beams and said first comb support are integrally formed and wherein said second comb beams and said second comb support are integrally formed.

10. The adjustment fixture of claim 5, wherein said first and second combs are of a particular thickness for regulating a length of the pins that protrude above an upper surface of the printed wiring board when the printed wiring board is mounted to the pins.

* * * * *